United States Patent [19]

Maier et al.

[11] Patent Number: 4,974,062
[45] Date of Patent: Nov. 27, 1990

[54] HOUSING FOR OPTO-ELECTRONIC COMPONENTS

[75] Inventors: Horst Maier; Gottfried Pähler, both of Heilbronn, Fed. Rep. of Germany

[73] Assignee: Licentia Patent-Verwaltungs-GmbH, Frankfurt, Fed. Rep. of Germany

[21] Appl. No.: 356,239

[22] Filed: May 24, 1989

[30] Foreign Application Priority Data

Jul. 7, 1988 [DE] Fed. Rep. of Germany ....... 3823006

[51] Int. Cl.$^5$ ............................................. H01L 25/04
[52] U.S. Cl. ........................................ 357/83; 357/81; 357/82; 357/17; 361/386; 250/352
[58] Field of Search .................. 357/17 L, 81, 83, 82; 250/352; 361/386; 155/80.5, 80.4, 104.28, 104.33

[56] References Cited

U.S. PATENT DOCUMENTS 2,951,944 9/1960 Fong .
4,621,279 1/1986 Maier et al. ........................ 357/83

FOREIGN PATENT DOCUMENTS 3138521  3/1983  Fed. Rep. of Germany .
2247845  4/1983  Fed. Rep. of Germany .
3337194  4/1985  Fed. Rep. of Germany .
3337195  4/1985  Fed. Rep. of Germany .
1168997 10/1969  United Kingdom .
2119071 11/1983  United Kingdom .

Primary Examiner—Rolf Hille
Assistant Examiner—Minh Loan Tran
Attorney, Agent, or Firm—Spencer & Frank

[57] ABSTRACT

The invention relates to a housing for opto-electronic components having an integrated Joule-Thomson cooler, the housing including a lower section, a center section and an upper section intended for radiation intake. The invention provides for the housing lower section and the housing center section, which enclose a heat exchanger pipe of the Joule-Thomson cooler, to be made of a material with low heat conductivity, and for the heat exchanger pipe to be arranged in coil form in one plane.

16 Claims, 3 Drawing Sheets

HOUSING FOR OPTO-ELECTRONIC COMPONENTS

BACKGROUND OF THE INVENTION

The invention relates to a housing for opto-electronic components with a cooler.

Many electronic components, particularly opto-electronic components, must be cooled to temperatures far below the ambient temperature in order to achieve their operating temperature or to reduce the thermal agitation noise, and placed in a Dewar vessel for heat insulation from the atmosphere.

Rapid cooling of the component in less than 2 s is often required in order for it to reach its operating temperature, while the cooling effect and so the operating capacity of the component is only to be maintained for a short time. For such purposes, Joule-Thomson coolers are used as a rule, in addition to Stirling or Peltier coolers, and achieve a temperature reduction of the gas by adiabatic expansion of a gas compressed to 100-300 bars.

With the aid of the countercurrent principle, the highly compressed gas flowing in from a high-pressure gas reservoir or from a compressor is pre-cooled before its expansion by the expanded gas flowing back in a heat exchanger pipe of the Joule-Thomson cooler that separates two media with differing temperatures.

By combined application of the process steps temperature reduction by adiabatic expansion and pre-cooling of the compressed gas in the heat exchanger, liquefaction of the cooling medium, e.g. nitrogen or argon gas, can be achieved. The operating temperature of the component then corresponds to the respective liquefaction temperature of the cooling medium used.

For cooling opto-electronic components with Joule-Thomson coolers, embodiments are known in which the entire Joule-Thomson cooler in the conventional design is inserted in a tightly fitting and completely separable housing, which comprises a glass inside wall and a metal outside wall for heat insulation.

The heat exchanger pipe of the Joule-Thomson cooler is wound in coiled form around a cylindrical or conical metallic support element and then soldered on. In addition, metal ribs can be soldered onto the outside of the heat exchanger pipe to increase the effective surface of the heat exchanger. The component to be cooled is inside the completely separable housing near to the end of the Joule-Thomson cooler at the level of the expansion nozzle, since the temperature is lowest there and so the cooling action is most effective. To prevent the upper side of the component icing up due to gas condensation and thereby rendering the component unserviceable, the Dewar vessel enclosing the Joule-Thomson cooler is evacuated.

To achieve a good cooling action, a Joule-Thomson cooler must have good insulation from the cold to the warm end both in the radial direction and along the support element. This is achieved in the prior art by the metallic support element for the heat exchanger pipe being designed with very thin walls because of the good heat conductivity of the metal.

The drawback here, however, is that due to the low strength of the thin-walled metal support element, stability problems occur. In addition, high production expenditure is needed since the support element is electro-deposited as a shaped part, the heat exchanger pipe is first wound onto the support element and then soldered, and the Joule-Thomson cooler must additionally be inserted into a very close-fitting housing for insulation purposes.

SUMMARY OF THE INVENTION

The object of the invention is to develop a housing in which the required poor heat conductivity of the support element and the good and rapid cooling action associated therewith of the Joule-Thomson cooler is combined with a high mechanical stability of the housing and a reduction of production expenditure.

For this purpose, the invention provides for the housing lower section and the housing center section, which enclose a heat exchanger pipe of the Joule-Thomson cooler, to be made of a material with low heat conductivity, and for the heat exchanger pipe to be arranged in coil form in one plane.

Due to the poor heat conduction properties of the housing center section and housing lower section enclosing the heat exchanger pipe, these parts can be designed with thick walls. The heat conduction in the radial direction is preferably reduced in addition by providing ribs on the stated housing parts. Thanks to the flat, planar arrangement of the heat exchanger pipe and to the fact that the housing and the Joule-Thomson cooler form a unit and the individual parts of the housing are firmly connected to one another, preferably bolted, stability against high pressures and external influences such as shock, vibration and temperature fluctuation is additionally increased.

The housing center section and the housing lower section preferably comprise plastic materials with poor heat conductivity, preferably polyimide or polyphenylene sulfide. These plastic housing parts can be series-manufactured as injection mouldings in view of their simple design, thereby considerably simplifying production.

Thanks to the compact design of the housing, the operating temperature of the component to be cooled is reached in less than 1 s. Because of the poor heat conductivity of the housing center section and housing lower section, and the good heat conduction and heat capacity of the housing upper section with window, no insulation vacuum is necessary for brief operation. For long operating periods, e.g. longer than 15 mins., the element space surrounding the opto-electronic component can be evacuated.

BRIEF DESCRIPTION OF THE DRAWINGS

The mode of operation of a Joule-Thomson cooler and its preferred embodiment and integration in the housing designed in accordance with the invention for an opto-electronic component, for example an IR sensor, is described in the following with reference to FIGS. 1 to 3.

DESCRIPTION OF THE PREFERRED EMBODIMENTS

Figure 1:
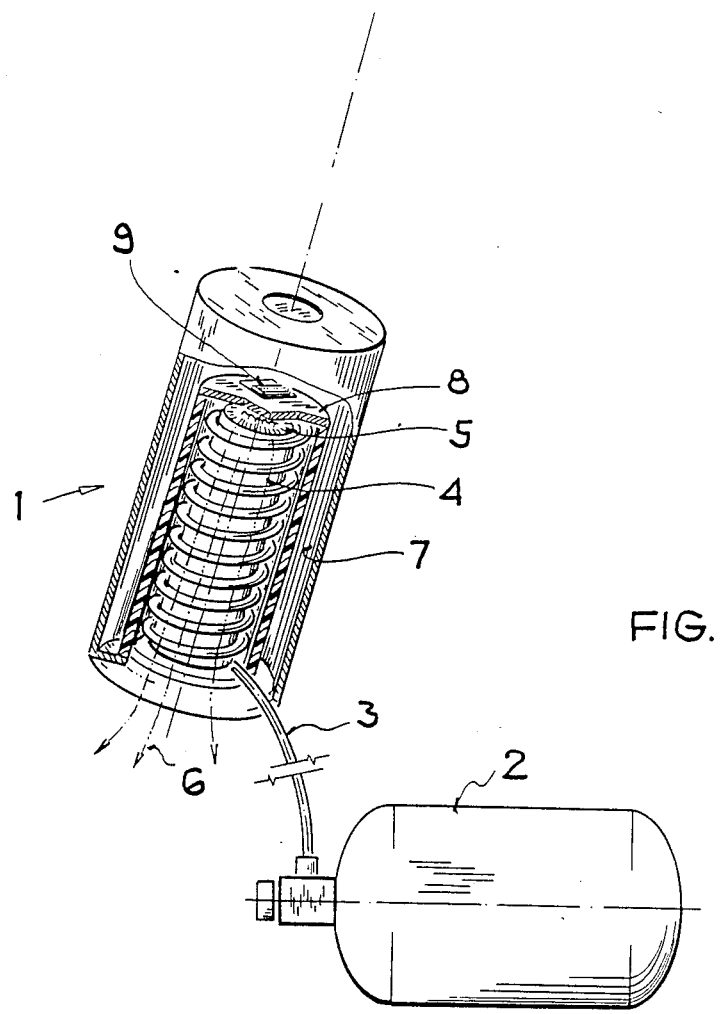
FIG. 1 shows in longitudinal section the schematic structure of a Joule-Thomson cooler in a housing according to the prior art.

FIG. 1 describes a Joule-Thomson cooler 1 with an open circuit in which the compressed cooling medium flows from a high-pressure gas reservoir 2 into heat exchanger pipe 3 which is wound in coiled form around a metallic support element 4. After passing through the heat exchanger pipe 3 the hot gas expands adiabatically in an expansion nozzle 5, leading to cooling of the operating gas depending on gas type and pressure. The cold gas 6 runs down the outside of heat exchanger pipe 3 and so pre-cools the compressed hot gas flowing in before it exits from cooler 1 into the atmosphere. An insulating vacuum or insulating shield 7 is used for heat insulation against the atmosphere. The object to be cooled is often designed as a cooling finger 8 that for example cools a detector 9 near to the end of the Joule-Thomson cooler.

Figure 2:
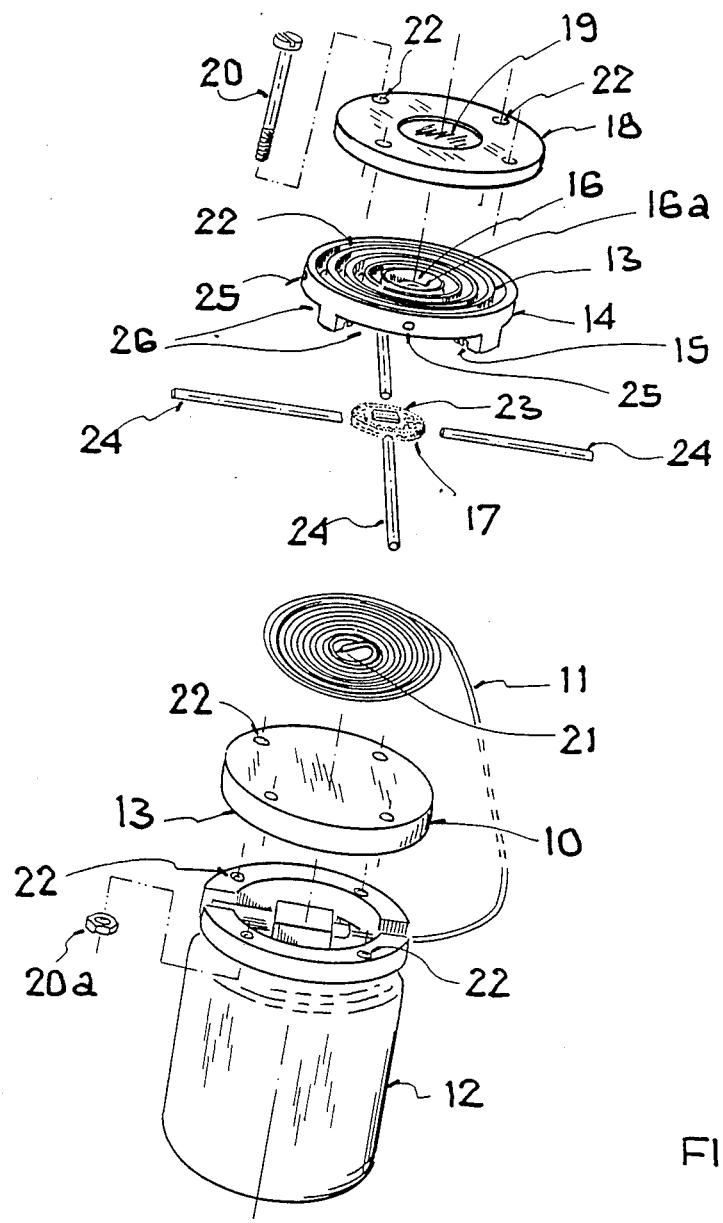
FIG. 2 shows an exploded view of the housing in accordance with the invention for an opto-electronic component with integrated Joule-Thomson cooler.
Figure 3:
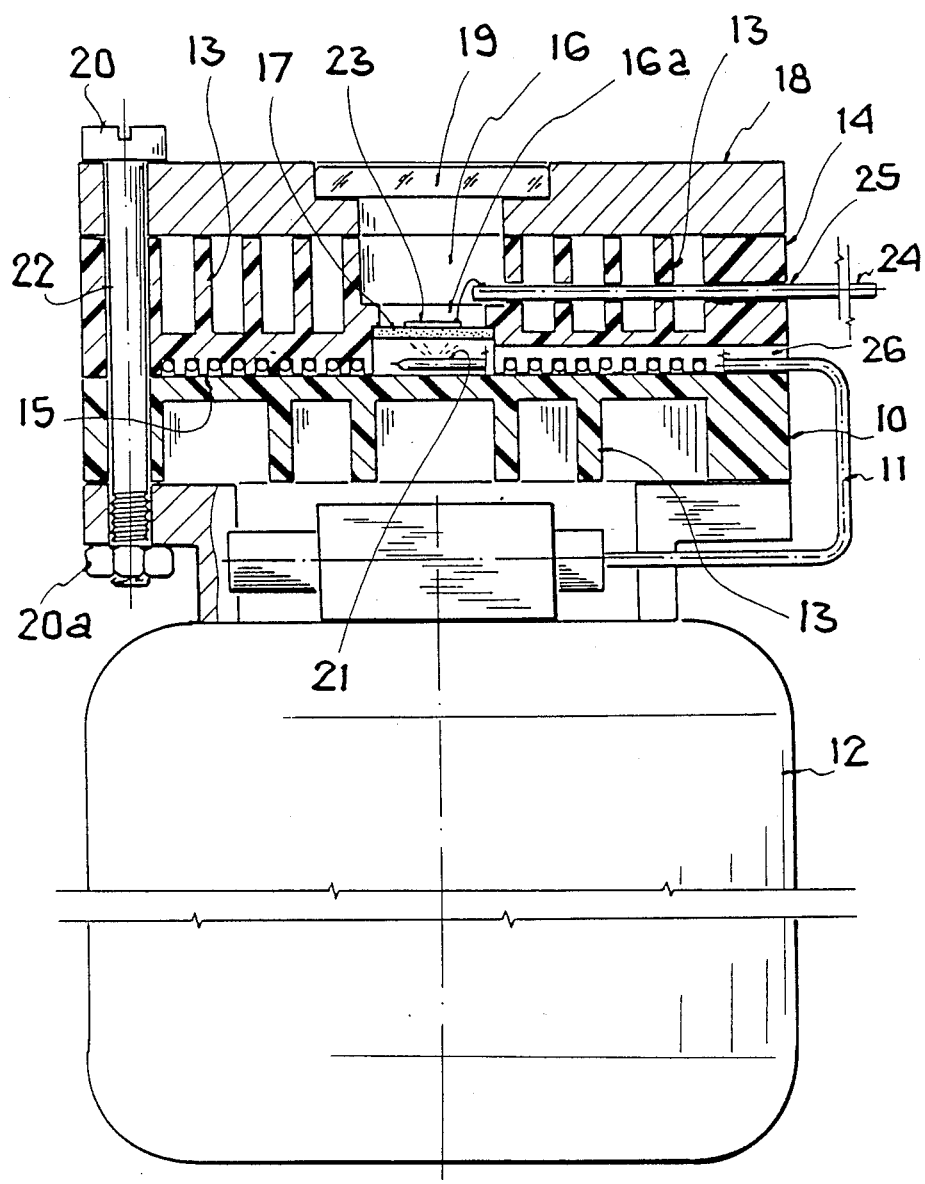
FIG. 3 shows a longitudinal section through the assembled housing.

In accordance with the exploded view in FIG. 2 and the diagram of the assembled housing in FIG. 3, the housing for the opto-electronic component comprises the following three parts bolted to one another:

Lower section 10 of the housing is preferably made of plastic and serves as a limiting wall for a heat exchanger pipe 11 and for the expanded gas flowing back. Because of the low heat conductivity of the plastic material used, for example polyimide, excellent heat insulation is possible against the atmosphere and metallic gas supply tank 12, which can be designed as the support element for the housing. To increase the insulation effect, ribs 13 in the form of concentric circles are additionally provided on the underside of the plastic lower section 10, as shown in FIG. 3.

Housing center section 14 comprises the same material as housing lower section 10 and contains on its underside channels 15 formed in ribs (unnumbered) shown in FIGS. 2 and 3, in which channels 15 heat exchanger pipe 11 is run and held. The upper side of housing center section 14 is, like the underside of housing lower section 10, ribbed. In a round recess 16 in the center of this housing section element holder 17 is fitted.

Housing upper section 18 comprises a thin metal plate, in which is incorporated inlet window 19 for the radiation to be detected. Because of the good heat conductivity and the thermal mass of the metal, premature misting of inlet window 19 is avoided.

Inlet window 19 must be transparent for the radiation to be detected. In the infra-red spectral range a Ge inlet window is used, for example.

The stated housing parts 10, 14, 18 can be additionally fastened to gas supply tank 12, for example using bolts 20 and nuts 20a. For this purpose the three housing sections and the gas supply tank are provided with holes 22 for the bolts.

The Joule-Thomson cooler in accordance with FIGS. 2 and 3 has an open circuit, and an operating time of 30 to 60 s is possible depending on the size of gas supply tank 12. Heat exchanger pipe 11 comprises a special steel pipe approved for pressures up to 1000 bars. To increase the effective surface of the heat exchanger, metallic ribs, not shown in FIGS. 2 and 3, are soldered onto heat exchanger pipe 11 and are of a metal with good heat conduction and low heating capacity, preferably molybdenum. The compressed gas expands at a capillary 21 at the end of heat exchanger pipe 11 and flows after pre-cooling of the inflowing gas through cutouts 26 in housing center section 14 radially to the outside.

Element space 16a, which contains element holder 17 and the semiconductor component 23 mounted thereon, is hermetically sealed to the top by metallic housing upper section 18, to the side by housing center section 14 of plastic, and to the bottom by metallic element holder 17. Element space 16a can in addition be evacuated, which is however not necessary for short operating times in view of the low condensable gas volume. Opto-electronic semiconductor component 23 is usually a ternary semiconductor, preferably on HgCdTe basis.

Element holder 17 comprises a material with good heat conductivity, preferably molybdenum or silicon, and is either glued or, after the plastic on the contact faces has been metallized, soldered into round recess 16 of the housing center section. On its underside, element holder 17 is cooled by the cold gas.

Conductive path supply lines 24 for providing contacts on the component pass radially outwards through the plastic and are glued into holes 25 in housing center section 14 or soldered into the previously metallized contact faces in the plastic.

In another embodiment for a longer operating duration or longer cooling action, element space 16a can be evacuated, preventing misting of the inlet window 19 by heat conduction via the gas filling the element space.

In an embodiment, the entire 3-part housing including the upper section 18, the center section 14 and the lower section 10 is 15 mm high and has a diameter of 35 mm; the plastic lower section 10 has four ribs, and the plastic center section 14 has five ribs in the form of concentric circles.

The heat exchanger pipe 11 is of special steel and has ten windings, and four channels are provided in the housing center section 14 to guide this pipe. The heat exchanger pipe 11 has an internal diameter of 0.35 mm and an external diameter of 0.55 mm; on its outside, molybdenum ribs are soldered on, and are approx. 2 mm high and laterally spaced at around 0.2 mm. The compressed gas expands in a capillary at the end of the innermost winding of the pipe 11; this capillary is designed as a 0.1 mm hole on the side of the pipe 11.

The detector element or semiconductor component 23, an HgCdTe semiconductor, is seated on an element holder 17 of silicon in a cutout or round recess 16 in the center of the housing center section 14 having a diameter of 6 mm. The element holder 17 has an area of approx. 30 mm$^2$, the detector element 23 an area of approx. 5 mm$^2$.

The gas reservoir or supply 2 has a volume of 20 cm$^3$, for example, and is contained in a special steel high-pressure tank firmly connected to the housing by four bolts 20.

With the embodiment shown, the operating temperature of the detector element 23 is achieved in less than 1 s and an operating time of approx 20 s is made possible.

These data can however be varied in many forms: for example, smaller or larger integrated housing/cooler arrangements can be manufactured in the same way, as can arrangements with longer or unlimited operating times, using a compressor instead of the gas supply tank 2, and with retrieval of the escaping cooling gas.

Thanks to its simple operating principle and simple construction, and its low susceptibility to faults, the described housing with an integrated Joule-Thomson cooler can be used in many applications. In particular, applications involving extremely high environmental strains, such as shock, vibration etc. are possible.

The opto-electronic components 23 to be cooled can be both single elements or multi-element detector arrays. The signals can be processed by preamplifiers or multiplexers either externally mounted or disposed within the integrated housing/cooler arrangement.

What is claimed is:

1. An infra-red detector housing with an integrated Joule-Thomson cooler, comprising:
    a Joule-Thomson cooler having a heat exchanger pipe which is disposed in a generally planar concentric spiral shape;
    a lower housing section, a center housing section connected to said lower housing section, and an upper housing section which is connected to said center housing section and which is adapted to permit passage of radiation through at least a portion thereof, said center housing section and said upper housing section together enclosing an element space for an infra-red detector; and wherein said housing lower section and said housing center section together enclose said heat exchanger pipe of said Joule-Thomson cooler and are composed of a material having a low heat conductivity.

2. An infra-red detector housing according to claim 1, wherein said center housing section includes a plurality of channels in a side of said center housing section which faces said lower housing section, and said heat exchanger pipe runs through and is held in said channels in said center housing section.

3. An infra-red detector housing according to claim 2, wherein the outside of said heat exchanger pipe includes a plurality of ribs which are composed of a metal having high heat conduction and low heat capacity.

4. An infra-red detector housing according to claim 3, wherein said ribs are composed of molybdenum.

5. An infra-red detector housing according to claim 1, wherein said upper, center, and lower housing sections are connected to one another in a firm and hermetically sealed manner.

6. An infra-red detector housing according to one claim 1, wherein said center housing section and said lower housing section are composed of plastic.

7. An infra-red detector housing according to claim 6, wherein the plastic material is selected from among polyimide and polyphenylene sulfide.

8. An infra-red detector housing according to claim 1, wherein said center housing section has a plurality of concentric ribs disposed on a side facing said upper housing section and a plurality of concentric ribs are disposed on a side of said lower housing section which is opposite said center housing section for providing heat insulation in a radial direction.

9. An infra-red detector housing according to claim 1, further comprising a cooled element holder for holding said infra-red detector, said cooled element holder is disposed in a centrally disposed recess in said center housing section, and wherein said element holder is composed of a material having good heat conductivity.

10. An infra-red detector housing according to claim 9, wherein said element holder is composed of one of molybdenum and silicon.

11. An infra-red detector housing according to claim 9, wherein an element space surrounds said infra-red detector, and said element space is sealed sufficiently to be evacuatable.

12. An infra-red detector housing according to claim 9, further comprising a plurality of conductive path supply lines for electrical connection to said infra-red detector, said conductive path supply lines being glued to said center housing section.

13. An infra-red detector housing according to claim 1, wherein said upper housing section is composed of metal and said at least a portion of said housing upper section includes an inlet window for receiving radiation to be detected.

14. Application of an infra-red detector housing according to claim 1 for cooling of IR-sensitive components on an HgCdTe basis.

15. Application of an infra-red detector housing according to claim 1 for cooling of IR-sensitive components of the infra-red detector with any one of: nitrogen, air, argon, freon, and mixtures thereof.

16. Application of an infra-red detector housing according to claim 1 for cooling of IR-sensitive components of an infra-red detector with sequential application of nitrogen, air, argon, freon, and mixtures thereof.

* * * * *